United States Patent
Licata et al.

(10) Patent No.: US 6,200,894 B1
(45) Date of Patent: *Mar. 13, 2001

(54) METHOD FOR ENHANCING ALUMINUM INTERCONNECT PROPERTIES

(75) Inventors: Thomas J. Licata, Lagrangeville; Katsuya Okumura, Poughkeepsie, both of NY (US); Kenneth P. Rodbell, Sandy Hook, CT (US)

(73) Assignees: International Business Machines Corporation, Armonk, NY (US); Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/661,160

(22) Filed: Jun. 10, 1996

(51) Int. Cl.[7] .................................................. H01L 21/44
(52) U.S. Cl. ........................... 438/688; 438/631; 438/787; 438/927
(58) Field of Search .................. 438/688, 927, 438/631, 633, 787; 257/765, 767

(56) References Cited

U.S. PATENT DOCUMENTS

| | | | |
|---|---|---|---|
| 4,017,890 | 4/1977 | Howard et al. | 257/768 |
| 4,352,239 | 10/1982 | Pierce | 438/660 |
| 4,377,438 * | 3/1983 | Moriya et al. | 438/627 |
| 4,438,450 | 3/1984 | Sheng et al. | 257/767 |
| 4,922,320 | 5/1990 | McDavid et al. | 257/739 |
| 5,001,541 | 3/1991 | Virkus et al. | 257/767 |
| 5,317,187 | 5/1994 | Hindman et al. | 257/659 |
| 5,360,995 | 11/1994 | Graas | 257/751 |
| 5,494,854 * | 2/1996 | Jain | 438/692 |
| 5,851,602 * | 12/1998 | Law et al. | 427/579 |

FOREIGN PATENT DOCUMENTS 64-323728   8/1991   (JP).

OTHER PUBLICATIONS

Lee, J., et al., "Room Temperature Deposition of Silicon Dioxide Films . . . ", J. Electrochem. Soc., vol. 143, No. 4, Apr. 1996, pp. 1443–1451.*

Suzuki, M., et al., "Roughness Evaluation of Thermally Oxidized Si . . . ", Jpn. J. Appl. Phys., vol. 32, Part 1, No. 3B, Mar. 1993, pp. 1419–1422.*

Onoda, H., et al., "Effects of Insulator Surface Roughness on al–alloy Film Properties and Crystallographic Orientation . . . ", IEEE International Reliability Proceedings, 34th Annual, Apr. 30–May 2, 1996, pp. 139–147.*

Wolf, S., et al., Silicon Processing for the VLSI Era, vol. 2, Lattice Press, pp. 189–212, 264–273. 1996.*

D.B. Knorr, et al, "Effects of Texture Microstructure, and Alloy Content Electromigration of Aluminum–Based Metallization,"SPIE, vol. 1805 Submicrometer Metallization, 1992, pp. 210–221.

A.G. Dirks, et al. "Al–Ti and Al–Ti Thin Alloy Films," J. Appl. Phys. vol. 59, No. 6, Mar. 15, 1986, pp. 2010–2014.

(List continued on next page.)

Primary Examiner—T. N. Quach
(74) Attorney, Agent, or Firm—Whitham, Curtis & Whitham; Daryl K. Neff, Esq.

(57) ABSTRACT

A method of enhancing the aluminum interconnect properties in very fine metalization patterns interconnecting integrated circuits that improves the texture and electromigration resistance of aluminum in thin films. Enhanced performance can be obtained by forming a smooth oxide layer in situ, or by surface conditioning a previously formed oxide layer in an appropriate manner to provide the requisite surface smoothness, then by refining the aluminum microstructure by hot deposition or ex-situ heat treatment.

17 Claims, 3 Drawing Sheets

OTHER PUBLICATIONS

H. Onoda, et al, "Effects of Insulator Surface Roughness on Al–Alloy Crystallographic Orientation in Al–Alloy/Ti/Insulator Structure," Jap. J. Appl. Phys., vol. 34, Aug. 15, 1995, Pt. 2, No. 8B, pp. L1037–1040.

C.V. Thompson (editor), et al, Materials Reliability in Microelectronics II, Symposium Apr. 27, 1992–May 1, 1992, Materials Research Society, 1992, pp. 94–101, "Electromigration in Bicrystal Al Lines".

* cited by examiner

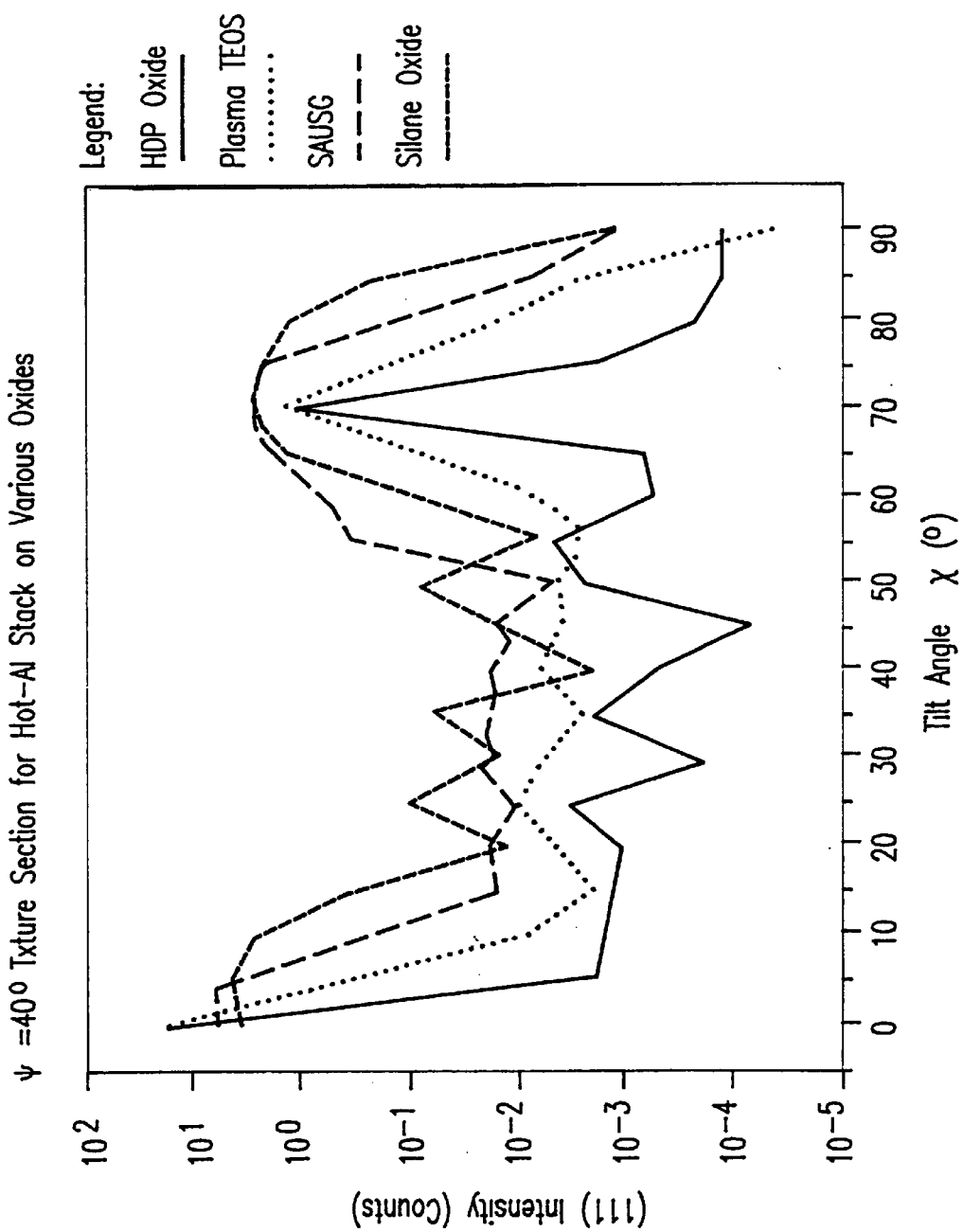

METHOD FOR ENHANCING ALUMINUM INTERCONNECT PROPERTIES

BACKGROUND OP THE INVENTION

1. Field of the Invention

The present invention generally relates to the manufacture of microelectronic systems and, more particularly, to enhancement of the interconnect properties of aluminum and aluminum alloy electrical conductors in fine line width conductor patterns with improved resistance to electromigration.

2. Background Description

Aluminum-based interconnects are commonly used in the industry due to their low resistivity and ease of fabrication. However, such interconnects are less reliable than either tungsten or copper-based interconnects since they are subject to electromigration, where electrical current induces damage in paths such as grain boundaries. Many different types of grain boundaries can form between aluminum grains, depending on their orientations, and different types of grain boundaries have been shown to produce enhanced or degraded reliability. See for example H. P. Longworth and C. V. Thompson, *MRS Symp. Proc.,* Vol. 265, 1992, pp. 95–100.

The "texture" of an aluminum film, as determined using X-ray diffraction, describes the distribution of grain orientations in a film, and hence indicates whether fewer or more types of grain boundaries exist in a film. More types of grain boundaries increase the likelihood that "weak" boundaries will be incorporated in an interconnect after patterning. Hence, the degree of texture in a film is an indication of how well the film will resist electromigration damage. See D. B. Knorr and K. P. Rodbell, *SPIE Vol.* 1805 Submicrometer Metalization 1992, pp. 120–221.

Effects of insulator surface roughness on Al-alloy film crystallographic orientation in Al-alloy/Ti insulator structures have been discussed by H. Onoda et al., Jpn. J. Appl. Phys., vol. 34 (1995), pp. 1037–1040.

SUMMRY OF THE INVENTION

It is therefore an object of the present invention to provide enhanced aluminum interconnect properties in very fine metalization patterns interconnecting integrated circuits.

According to the invention, a method is provided for enhancing the texture and electromigration resistance of aluminum thin films in layered interconnects by appropriate control of the surface roughness of the underlying insulator layer, typically an oxide layer. Specifically, enhanced performance is obtained in aluminum interconnects of the present invention by endowing an underlying insulator layer with reduced surface roughness. This can be accomplished by various techniques within the scope of this invention, such as by choice of insulator film material and film formation mode per se and/or by surface conditioning, e.g., planarization, of a previously deposited insulator film in an appropriate manner to impart the requisite surface smoothness, followed by aluminum or aluminum alloy layered structure formation and refining the aluminum microstructure formed thereon by hot deposition or ex-situ heat treatment.

In the present invention, the planarity of the insulator underlying the aluminum film, in terms of mean surface roughness, $R_{ms}$ as measured by atomic force microscopy (AFM), generally is below the 10 nm level, preferably below the 5 nm level, to impart a qualitative improvement in the texture and electromigration resistance to the aluminum or aluminum alloy thin films subsequently formed thereon.

In the present invention, the aluminum thin films can be pure aluminum, or alloys of aluminum, such as aluminum alloyed with a transition or refractory metal to enhance the reliability of the interconnect. Aluminum alloys can be prepared by planar dc-magnetron sputtering and anealing methods. Exemplary aluminum alloys include $Al_3Ti$, Al—Ti, Al—Ti—Si, Al—Cu, Al—Si, Al—Si—Cu, Ti/Al—Cu, and the like. The insulator layer can be an oxide type. The oxide layer can be formed by techniques including oxidation of silane to form silane oxide such as by using either oxygen or nitrous oxide oxidants in APCVD or LPCVD systems operated at about 450° C.; formation of sub-atmospheric undoped silicon glass (SAUSG); pyrolytic oxidation of an alkoxysilane in CVD such as by oxidation of tetraethylorthosilane (TEOS) in a PECVD system at temperatures as low as about 300° C.; forming high density plasma (HDP) deposited oxide; and thermally growing oxides, e.g., growing thermal oxides of silicon as formed by maintaining a silicon surface in an elevated temperature in an oxidizing environment (e.g., dry oxygen or water vapor).

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a graph showing texture selection for hot aluminum film stacks deposited on various oxides;

DETAILED DESCRIPTION OF THE PREFERRED EMBODIMENTS OF THE INVENTION

Figure 2A:
FIG. 2A is a photomicrograph of a cross-section of an aluminum film on silane oxide formed by a method of the invention (340,000×magnification)

Referring now to the drawings, and more particularly to FIG. 1, there is shown a graph showing the distributions of (111) grains for a hot aluminum film layer stack with various underlying insulator oxides. The insulator oxides investigated were silane oxide (i.e., a plasma silane), sub-atmospheric undoped silicon glass (SAUSG), plasma tetra-ethylorthosilane (i.e., plasma TEOS), and high density plasma oxide (i.e., HDP oxide), which are formed with increasing amounts of bombardment resulting in increasingly smooth insulator layer surfaces.

The oxide film deposition parameters, viz., the substrate temperature $T_{sub}$, chamber pressure, and source gases, used to form each of these various oxide layers on a silicon substrate and the respective surface roughnesses measured for each oxide layer formed are summarized in Table 1. The thickness of each of the silane oxide, SAUSG, plasma TEOS, and HDP oxide layers formed was from about 1,000 to about 1,500Å. The surface roughness of each oxide film was determined by atomic force microscopy (AFM).

TABLE 1

| Oxide Layer | | | | Surface Roughness | |
|---|---|---|---|---|---|
| | Deposition Conditions | | | $R_{ms}$, Mean | |
| Oxide Layer | $T_{sub}$ (° C.) | P (Torr) | Gases (SCCM) | $T_{ox}$ (nm) | Roughness (nm) |
| Silane Oxide | 400 | 2.4 | $SiH_4$:300 $N_2O$:9500 | 300 | 8 |
| SAUSG | 350 | 400 | TEOS:2200 $O_3$:300 $O_2$:4700 | 300 | 47 |
| Plasma TEOS | 400 | 5 | TEOS:75 $O_2$:840 | 300 | 2.6 |
| HDP Oxide | 380 | $6 \times 10^{-3}$ | $SiH_4$:20 $O_2$:37 Ar:20 | 300 | 0.7† (3)‡ |

† HDP oxide formed with no bias
‡ HDP oxide formed at 500 W bias

For each of the formed silane oxide, SAUSG, plasma TEOS, and HDP oxide oxide layers, an aluminum alloy/Ti layered structure was formed on its surface. The procedure for forming the metal layered structure was the same for each oxide layer and involved sequential dc-magnetron sputter deposition of the following films, in this order, 200Å of Ti ($T_{sub}$=room temperature), then 2,000Å of Al—Cu—Si alloy (about 0.3 wt. Cu, about 0.8 wt.% Si, $T_{sub}$=50° C.), and finally 5,500Å Al—Cu ($T_{sub}$=525° C.). The sputtering system had a base pressure of about $2 \times 10^{-8}$ Torr.

The X-ray plots in FIG. 1 show that the smoother the underlying insulator film is, the better the texture of the overlying aluminum alloy layer formed; i.e., narrower, more intense peak at 0° tilt and lower intensity at intermediate angles that correspond to randomly oriented grains.

Figure 2B:
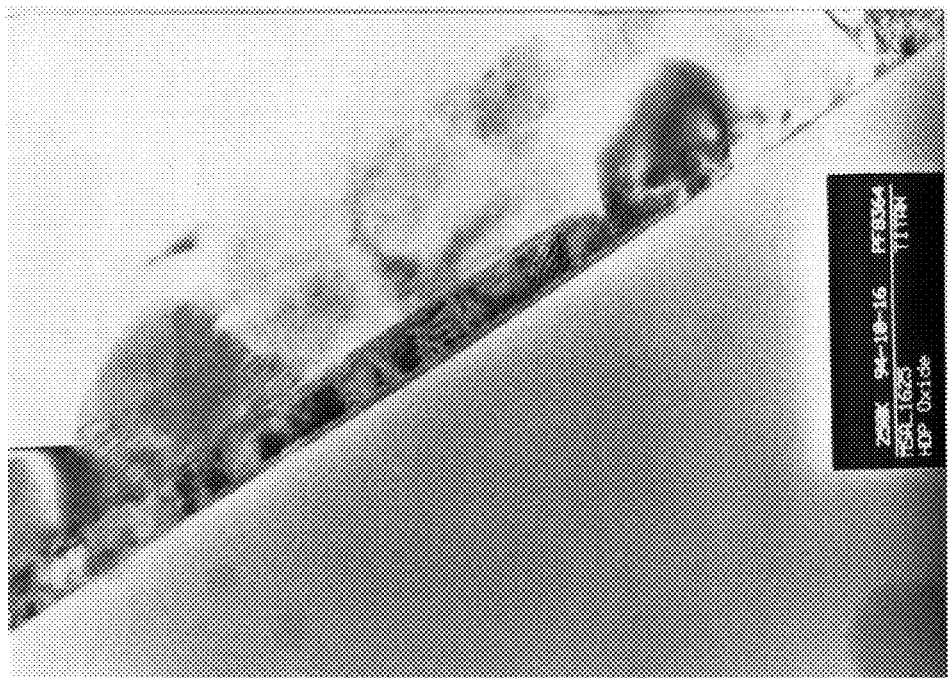
FIG. 2B is a photomicrograph of a cross-section of an aluminum film on high density plasma (HDP) oxide formed by a method of the invention (340,000×magnification).

The mean surface roughness of each aluminum alloy film was determined by atomic force microscopy (AFM). The aluminum texture and morphology was assessed visually from photomicrographs taken of cross-sections of the stack, such as shown in FIG. 2A (silane oxide, i.e., plasma silane), where the $Al_3Ti$ layer has a sightly undulated, yet smooth surface as can be seen, and FIG. 2B (HDP oxide), where the $Al_3Ti$ layer has a very smooth surface contour. In FIGS. 2A and 2B, the oxide layer is the bulk layer occupying the lower right-hand corner.

The optical, electrical, textural, and morphological properties of the resulting aluminum alloy layer overlying the insulator layer in each type of oxide formed are summarized in Table 2 (σ=std. deviation).

TABLE 2

| | Oxide Layer | | | |
|---|---|---|---|---|
| Al Film Property | Silane Oxide | SAUSG | Plasma TEOS | HDP Oxide |
| Reflectivity (%) | 48.5 | 53.7 | 74.7 | 87.7 |
| Resistivity (mΩ/sq) | 0.432 | 0.430 | 0.415 | 0.408 |
| Grain Size (μm, σ) | 1.96, 1.47 | 1.92, 1.50 | 2.05, 1.57 | 1.98, 1.62 |
| Al (111) Texture | fair | fair | good | great |
| Al Surface Roughness (mean (nm), σ) | 36.5, 46.0 | 26.8, 33.5 | 17.5, 22.7 | 7.4, 10.2 |
| Ti Phases | $TiAl_3$ | $TiAl_3$ | Ti-rich/$TiAl_3$ | Ti-rich/$TiAl_3$ |
| $TiAl_3$ Morphology | rough | rough | smoother | smoother |

As shown in Table 2, enhanced aluminum alloy film texture is accompanied by reduced film resistivity, better film planarity, and a smoother $TiAl_3$ morphology (larger process window) useful in preventing agglomeration of the hot aluminum stack, as shown in FIGS. 2A and 2B for the examples of silane oxide and high density plasma (HDP) oxide, respectively. Table 2 also indicates that film reflectivity is a quick and useful in-line measurement technique for these benefits.

In separate experiments described hereinafter, it also has been shown that these same advantages can be produced by appropriately surface conditioning a conventionally previously formed oxide layer. For example, Table 3 shows the reflectivities and resistivities of hot aluminum films deposited on silane oxide and plasma TEOS oxide layers as surface treated (i.e., planarized) by chemical-mechanical polishing (CMP) and two oxide etch processes.

For silane oxide samples 1–4, 6450Å of silane oxide was formed for each sample by under the same conditions described in Table 1 for forming "Silane Oxide" in a LPCVD system. For TEOS samples 1–4, a 6450Å thick silicon oxide layer was formed for each sample by pyrolytic oxidation of tetraethylorthosilane (TEOS) in a PECVD system under the same conditions described for forming "Plasma TEOS" in Table 1.

Except for comparative Silane Oxide sample 4 and Plasma TEOS Oxide sample 4, the oxide films, after formation and before metal deposition thereon, were either etched according to etch condition M1 or C1, or chemical-mechanical planarized, to remove 1000 to 1500Å of surface oxide.

In etch condition M1 used to planarize Silane Oxide 1 and Plasma TEOS Oxide 1, the oxide layer was dry etched in a plasma reactor with a plasma formed from 20 SCCM $CHF_3$, 60 SCCM $CF_4$, 500 SCCM Argon and 10 Torr helium for 15 seconds at 240 mTorr, 1300 W, with an upper electrode at 40° C. and lower electrode at 15° C. and spacing of 1 cm.

In etch condition C1 used to planarize Silane Oxide 2 and Plasma TEOS Oxide 2, the oxide layer was dry etched in a plasma formed in a reactive ion etcher from 10 SCCM $C_4F_8$, 50 SCCM CO, and 200 SCCM Argon for 25 seconds at 40 mTorr, 2000 W, with a 60° C. wall and 0° C. wafer and a spacing of 30 cm.

In the CMP process used to planarize Silane Oxide 3 and Plasma TEOS Oxide 3, the CMP was carried out with fused silica base slurry and the down force was 7.5 psi.

After planarizing the insulator films by either etching or CMP as in the case of silane and TEOS Oxides 1–3, or directly after oxide formation as in the case of silane and TEOS Oxides 4, metal lines were formed on each type of oxide studied. The metal lines were formed in the same manner on each oxide substrate by sequential sputter-deposition of a 200Å titanium layer; then a 2000Å AlCuSi alloy (50° C.), and finally a 5500Å AlCu (525° C.) layer, in that sequence, using a multi-chamber dc-magnetron sputtering system having a base pressure of about $2 \times 10^{-8}$ Torr. The metal lines patterns were formed by conventional photolithographic methods. The insulator/metal film structures were annealed at 400° C. in flowing $N_2$ (90%)/$H_2$(10%) ambient for 20 minutes.

All insulator/aluminum film structures were studied directly after deposition and after annealing. The reflectivity and resistivity properties of the aluminum-containing film were measured and are summarized in Table 3.

TABLE 3

| Oxide Type | M1 Etch | C1 Etch | CMP | Reflectivity % | σ % | Rs (mΩ/sq), | σ % |
|---|---|---|---|---|---|---|---|
| Silane Oxide 1 | X | — | — | .695 | 4.73 | .04248 | 3.59 |
| Silane Oxide 2 | — | X | — | .853 | 1.21 | .04048 | 2.11 |
| Silane Oxide 3 | — | — | X | .880 | 0.41 | .03991 | 1.81 |
| Silane Oxide 4 | — | — | — | .728 | 3.62 | .04142 | 2.30 |
| Plasma TEOS Oxide 1 | X | — | — | .884 | 0.69 | .03999 | 2.06 |
| Plasma TEOS Oxide 2 | — | X | — | .845 | 0.73 | .04052 | 1.84 |
| Plasma TEOS Oxide 3 | — | — | X | .882 | 0.45 | .04001 | 1.97 |
| Plasma TEOS Oxide 4 | — | — | — | .884 | 0.40 | .04002 | 1.90 |

Again, it is evident from the results summarized in Table 3 that plasma TEOS yields generally superior films to silane oxide. However, the inventors have discovered that the less costly silane oxide can be improved to provide equivalent performance by CMP or the C1 etch process.

While the present invention has been illustrated in terms of TEOS derived-oxides, silane oxides, high density plasma oxides, it will be understood that other oxide forming techniques can be applied to the present invention, such as thermally grown oxide. Also, other insulator substrate materials, and not merely oxides, that can be imbued with smooth surfaces can also be used as the underlayer for the aluminum films to yield similar results in favorably controlling the aluminum texture for elctromigration performance and metal line reliability in an aluminum (alloy) layered interconnection.

While the invention has been described in terms of preferred embodiments, those skilled in the art will recognize that the invention can be practiced with modification within the spirit and scope of the appended claims.

Having thus described our invention, what we claim as new and desire to secure by letters patent is as follows:

1. A method of making an aluminum-based interconnection on a semiconductor substrate in which the interconnection resists electromigration, comprising steps of:
   (a) forming an insulator layer on said substrate, said insulator layer having a mean surface roughness Rms of less than 10 nm as a result of a material from which said insulator layer is made and a deposition process used to form said insulator layer on said substrate; (b) forming an aluminum-containing layer on said insulator layer without first subjecting a top surface of said insulator layer to a roughening process;
   wherein the mean surface roughness of said insulator layer increases a resistance of said aluminum-containing layer to electromigration.

2. The method of claim 1, wherein said aluminum-containing layer is selected from the group consisting of pure aluminum and aluminum alloys.

3. The method of claim 2, wherein said aluminum is an aluminum alloy selected from the group consisting of $Al_3Ti$, Al—Ti, Al—Ti—Si, Al—Cu, Al—Si, Al—Si—Cu, and Ti/Al—Cu.

4. The method of claim 1, wherein said material from which said insulator layer is made includes an oxide layer.

5. The method of claim 4, wherein said oxide layer is a silicon oxide layer.

6. The method of claim 4, wherein said material used to form said oxide layer is selected from the group consisting of oxidation of silane, formation of sub-atmospheric undoped silicon glass (SAUSG), pyrolytic oxidation of an alkoxysilane in CVD, formation of high density plasma (HDP) deposited oxide, and thermally growing said oxide layer.

7. The method of claim 4, wherein said oxide layer is formed by oxidation of tetraethylorthosilane (TEOS) in a PECVD system at about 300° C.

8. The method of claim 1, wherein said insulator layer is formed in step (a) with a mean surface roughness $R_{ms}$ of less than 5 nm.

9. The method of claim 1, wherein said insulator layer formed in step (a) includes depositing a first insulator layer, and
   wherein said method further comprises:
      planarizing said first insulator layer to form a second insulator layer with reduced thickness said planarizing step further increasing electromigration resistance of said aluminum-containing layer.

10. The method of claim 9, wherein said planarizing is performed by anistropic dry etching.

11. The method of claim 9, wherein said planarizing is performed by chemical-mechanical polishing (CMP).

12. The method of claim 9, wherein said insulator layer is made of a material which includes one of a silane oxide and a TEOS oxide.

13. The method of claim 12, wherein said insulator layer is a silane oxide and wherein said planarizing step is performed in accordance with steps that include dry etching the silane oxide layer in a plasma formed from 10 SCCM $C_4F_8$, 50 SCCM CO, and 200 SCCM argon for 25 seconds at 40 m Torr, 2000 W, with a 60° C. wall and a 0° C. wafer and a spacing of 30 cm.

14. The method of claim 12, wherein said insulator layer is a silane oxide and wherein said planarizing step is performed in accordance with a chemical etching process using a fused silica base slurry and a down force of 7.4 psi.

15. The method of claim 1, further comprising:
   measuring reflectivity of a surface of said aluminum-containing layer to confirm that said aluminum-containing layer has a desired texture resulting from the mean surface roughness of said insulator layer.

16. The method of claim 1, wherein the surface roughness of said insulator layer is further determined by at least one condition of a deposition process used to form said insulator layer of said substrate, said at least one condition selected from a group consisting of substrate temperature, chamber pressure, and source gases.

17. The method of claim 1, further comprising:
   measuring, by x-ray diffraction, crystallographic orientation of said aluminum-containing layer, said crystallographic orientation providing an indication of a texture of said aluminum-containing layer that provides an indication of electromigration resistance of said layer.

* * * * *